(12) United States Patent
Balteanu et al.

(10) Patent No.: US 10,581,389 B1
(45) Date of Patent: Mar. 3, 2020

(54) RECONFIGURABLE AMPLIFIER LOADS AND OPERATING METHODS

(71) Applicant: QUALCOMM Incorporated, San Diego, CA (US)

(72) Inventors: Andreea Balteanu, La Jolla, CA (US); Karthikeya Aruppukottai Boominathan, San Diego, CA (US); Mahim Ranjan, San Diego, CA (US); Ning Yuan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/146,525

(22) Filed: Sep. 28, 2018

(51) Int. Cl.
*H03F 3/45* (2006.01)
*H03F 1/56* (2006.01)
*H04B 1/16* (2006.01)
*H03F 1/02* (2006.01)
*H04B 1/04* (2006.01)

(52) U.S. Cl.
CPC ........... *H03F 1/565* (2013.01); *H03F 1/0277* (2013.01); *H04B 1/1607* (2013.01); *H03F 2200/451* (2013.01); *H04B 2001/0408* (2013.01)

(58) Field of Classification Search
CPC ....................................................... H03F 3/45
USPC .................................................. 330/252, 165
See application file for complete search history.

(56) References Cited

U.S. PATENT DOCUMENTS

| 7,446,603 | B2 * | 11/2008 | Wong | H03F 1/305 |
| | | | | 330/10 |
| 9,602,065 | B2 * | 3/2017 | Mizokami | H03F 1/565 |
| 10,305,533 | B2 * | 5/2019 | Mizokami | H04B 1/48 |

* cited by examiner

*Primary Examiner* — Henry Choe
(74) *Attorney, Agent, or Firm* — Michael R. Harris (57) ABSTRACT

A reconfigurable amplifier load includes a power supply node, a first inductor comprising a first terminal coupled to a first switch, and a second inductor comprising a first terminal coupled to a second switch. The reconfigurable amplifier load further includes a third inductor comprising a first terminal coupled to the first switch. The first switch is configured to selectively couple the first terminal of the third inductor to the power supply node. A fourth inductor comprising a first terminal coupled to the second switch. The second switch is configured to selectively couple the first terminal of the fourth inductor to the power supply node. At least one additional switch configured to selectively couple a second terminal of the first inductor or a second terminal of the second inductor or both the second terminal of the first inductor and the second terminal of the second inductor to the power supply node.

10 Claims, 10 Drawing Sheets

```
┌─────────────────────────────────────────────┐
│ Couple a first inductor and a second inductor to a power supply │
│                    node                     │
│                    1002                     │
└─────────────────────────────────────────────┘
                       │
                       ▼
┌─────────────────────────────────────────────┐
│  Conduct first signals through a load line, the load line  │
│  comprising a third inductor, the first inductor, the second │
│    inductor, and a fourth inductor coupled in series    │
│                    1004                     │
└─────────────────────────────────────────────┘
                       │
                       ▼
┌─────────────────────────────────────────────┐
│ Reconfigure the load line by disconnecting a terminal of the │
│ first inductor and a terminal of the second inductor from the │
│ power supply node and connecting a terminal of the third │
│ inductor and a terminal of the fourth inductor to the power │
│                  supply node                │
│                    1006                     │
└─────────────────────────────────────────────┘
                       │
                       ▼
┌─────────────────────────────────────────────┐
│   Conduct second signals through the third inductor and the   │
│        fourth inductor of the reconfigured load line         │
│                    1008                     │
└─────────────────────────────────────────────┘
```

FIG. 10

RECONFIGURABLE AMPLIFIER LOADS AND OPERATING METHODS

FIELD

The present disclosure relates generally to wireless communications and more particularly to reconfigurable amplifier loads.

BACKGROUND

Amplifiers are commonly used in various electronic devices to provide signal amplification. Different types of amplifiers are available for different uses. For example, a wireless communication device such as a cellular phone may include a transmitter and a receiver for bi-directional communication. The transmitter may include a driver amplifier (DA) and a power amplifier (PA). The receiver may include a low noise amplifier (LNA), and the transmitter and receiver may include variable gain amplifiers (VGAs).

A transmitter may have an amplifier module that may include multiple amplifiers (e.g., a driver amplifier and a power amplifier). In some wireless transmitters of the wireless communication device, a driver amplifier has a differential-to-single-ended transformer (e.g., a balun) as its load and can provide single-ended outputs. Some power amplifiers are differential power amplifiers and therefore specify a single-ended-to-differential balun at their input when driven in accordance with a single-ended input. The design of such transformer load circuits of the amplifiers involves balancing various tradeoffs.

SUMMARY

In one aspect of the disclosure, a reconfigurable amplifier load is provided. The reconfigurable amplifier load includes a power supply node. The reconfigurable amplifier load further includes a first inductor including a first terminal coupled to a first switch. The reconfigurable amplifier load further includes a second inductor including a first terminal coupled to a second switch. The reconfigurable amplifier load further includes a third inductor comprising a first terminal coupled to the first switch. The first switch is configured to selectively couple the first terminal of the third inductor to the power supply node. The reconfigurable amplifier load further includes a fourth inductor including a first terminal coupled to the second switch. The second switch is configured to selectively couple the first terminal of the fourth inductor to the power supply node. The reconfigurable amplifier load further includes at least one additional switch configured to selectively couple a second terminal of the first inductor or a second terminal of the second inductor or both the second terminal of the first inductor and the second terminal of the second inductor to the power supply node.

In another aspect of the disclosure, a reconfigurable amplifier load is provided. The reconfigurable amplifier load includes a power supply node. The reconfigurable amplifier load further includes a first inductor including a first terminal coupled to a first terminal of a first switch and further including a second terminal coupled to the power supply node. The reconfigurable amplifier load further includes a second inductor including a first terminal coupled to a first terminal of a second switch and further including a second terminal coupled to the power supply node. The reconfigurable amplifier load further includes a third inductor including a first terminal coupled to a second terminal of the first switch and to a third switch. The third switch is configured to selectively couple the first terminal of the third inductor to the power supply node. The reconfigurable amplifier load further includes a fourth inductor including a first terminal coupled to a second terminal of the second switch and to a fourth switch. The fourth switch is configured to selectively couple the first terminal of the fourth inductor to the power supply node.

In yet another aspect of the disclosure, a reconfigurable amplifier load is provided. The reconfigurable amplifier load includes a power supply node. The reconfigurable amplifier load further includes a first inductor including a first terminal coupled to a first switch. The reconfigurable amplifier load further includes a second inductor including a first terminal coupled to a second switch. The reconfigurable amplifier load further includes a third inductor including a first terminal coupled to the first switch. The first switch is configured to selectively couple the first terminal of the third inductor to the power supply node. The reconfigurable amplifier load further includes a fourth inductor including a first terminal coupled to the second switch. The second switch is configured to selectively couple the first terminal of the fourth inductor to the power supply node. The reconfigurable amplifier load further includes means for selectively coupling a second terminal of the first inductor or a second terminal of the second inductor or both the second terminal of the first inductor and the second terminal of the second inductor to the power supply node.

In yet another aspect of the disclosure, a reconfigurable load line operation method is provided. The method includes coupling a first inductor and a second inductor to a power supply node. The method further includes conducting first signals through a load line, the load line comprising a third inductor, the first inductor, the second inductor, and a fourth inductor coupled in series. The method further includes reconfiguring the load line by disconnecting a terminal of the first inductor and a terminal of the second inductor from the power supply node and connecting a terminal of the third inductor and a terminal of the fourth inductor to the power supply node. The method further includes conducting second signals through the third inductor and the fourth inductor of the reconfigured load line.

DETAILED DESCRIPTION

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

A wireless communication device includes a transmitter circuit that may include multiple amplifiers including a driver amplifier (DA) and a power amplifier (PA) to amplify signals before the signals are transmitted by an antenna. A signal amplified by a driver amplifier may be provided to a power amplifier or to another amplifier stage for further amplification. An amplifier load circuit may be electrically connected to an output of the driver amplifier to condition a signal amplified by the driver signal for a subsequent amplifier stage. For example, a driver amplifier load circuit may include a transformer for matching and/or for conversion from a differential to a single-ended signal that is provided to a subsequent amplifier stage (e.g., the transformer may be configured a balun).

For a driver amplifier load circuit including a transformer, the turn ratio between the primary side and the secondary side of the transformer is selected to meet various transmission requirements at or near the maximum power output levels permitted. The transmission requirements may relate to emissions, signal interference, and the like. The turn ratio selected to meet these requirements results in a particular current consumption by the transformer. When this turns ratio is fixed, the amount of current consumption may also be fixed regardless of the power level be used. As a result, even when operating at lower power levels where the transmission requirements are more easily met, the current consumption is the same (i.e., a different turns ratio that results in a lower current consumption would have met transmission requirements at these lower power levels).

In an aspect, a driver amplifier load circuit may include a reconfigurable primary coil on the load transformer (e.g., load balun). The reconfigurable primary coil is configured to be electronically controlled to adjust the turns ratio of the transformer based on different output power levels of the driver amplifier. For example, the reconfigurable primary coil is configured so that a lower turns ratio is used for a first range of power levels while a higher turns ratio is used for a second range of power levels lower than the first range of power levels. The higher turns ratio has a lower current consumption than the lower turns ratio. Re-configuring the turns ratio allows therefore to improve current consumption during periods when the lower power levels are used.

Figure 1:
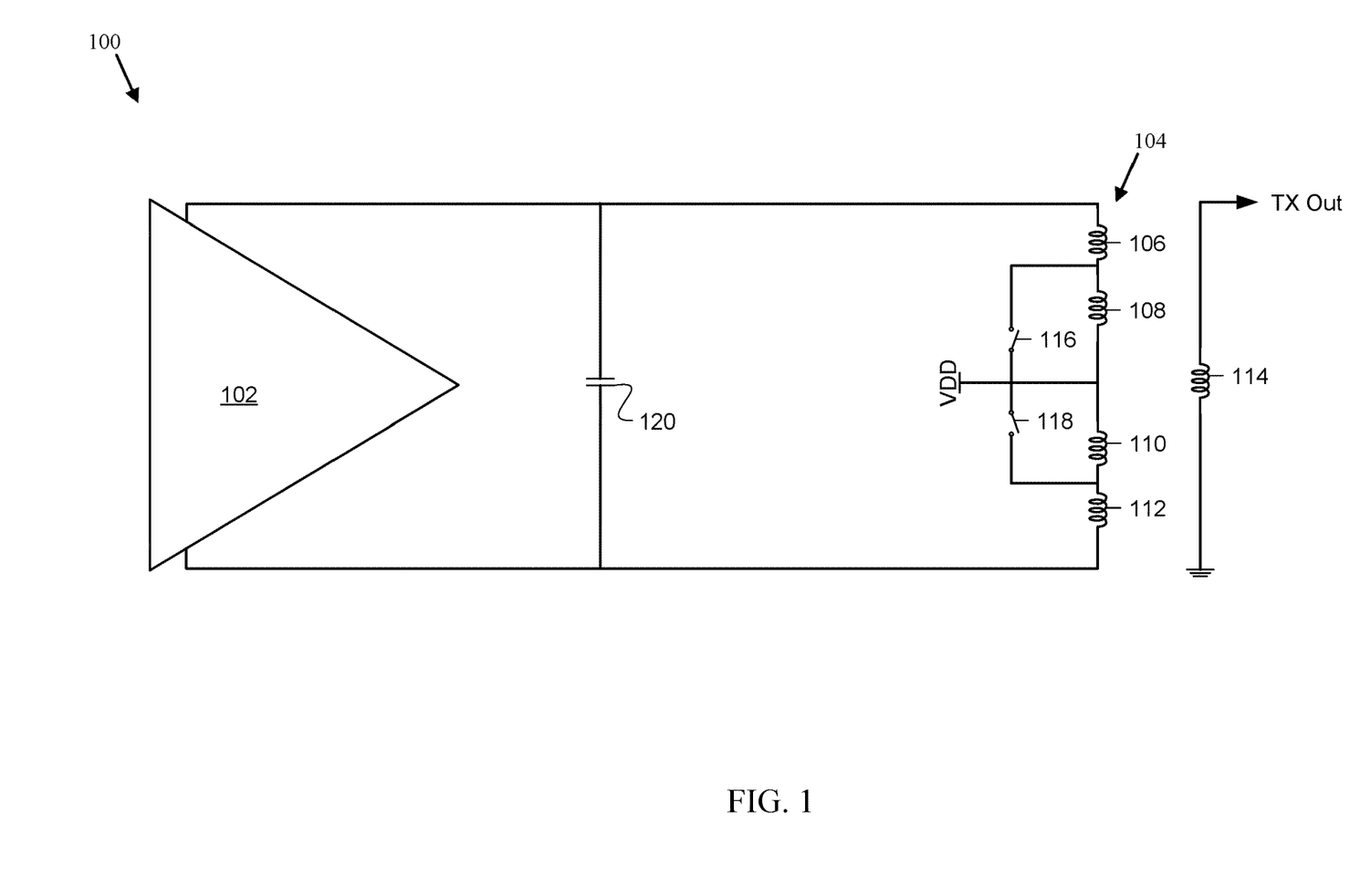
FIG. 1 is a schematic diagram of a circuit including an amplifier with a reconfigurable amplifier load.

FIG. 1 is a schematic diagram of a circuit 100 including an amplifier 102 with a reconfigurable amplifier load 104. In certain aspects, the amplifier 102 is a driver amplifier but may represent any type of amplifier stage. The amplifier 102 depicted in FIG. 1 provides first and second outputs (e.g., differential outputs). In certain aspects, the amplifier 102 is configured as a differential driving amplifier. The circuit 100 further includes a capacitor 120 coupled between the two outputs of the amplifier 102. The circuit 100 includes a power supply node VDD connected to a power supply (not shown). The circuit 100 further includes a first inductor 108 that has a first terminal coupled to a first switch 116. The circuit 100 further includes a second inductor 110 that has a first terminal coupled to a second switch 118. The circuit 100 further includes a third inductor 106 that has a first terminal coupled to the first switch 116. The first switch 116 is configured to selectively couple the first terminal of the third inductor 106 to the power supply node VDD. The circuit 100 further includes a fourth inductor 112 that has a first terminal coupled to the second switch 118. The second switch 118 is configured to selectively couple the first terminal of the fourth inductor 112 to the power supply node VDD. The third inductor 106, the first inductor 108, the second inductor 110, and the fourth inductor 112 are coupled in series. In an aspect, the power supply node VDD is connected to a node between the first inductor 108 and the second inductor 110.

The first inductor 108, the second inductor 110, the third inductor 106, and the fourth inductor 112 form portions of a primary side of a transformer. The circuit 100 further includes an output inductor 114 magnetically coupled to the first inductor 108, the second inductor 110, the third inductor 106, and the fourth inductor 112. The output inductor 114 forms a secondary side of the transformer. The output inductor 114 may provide a single ended input as shown in FIG. 1 where one terminal of the output inductor 114 is electrically connected to ground. In other implementations, the output inductor 114 may have a differential output.

As depicted in the example in FIG. 1, the first inductor 108, the second inductor 110, the third inductor 106, and the fourth inductor 112, and the output inductor 114 form at least a portion of a differential-to-single-ended transformer (e.g., balun). The output of the circuit 100 may be provided in certain implementations to other amplifier stages such as to a power amplifier. A signal output may be eventually transmitted via an antenna (not shown).

Controlling the states of the first switch 116 and the second switch 118 allows for reconfiguring the turns ratio between the primary side and the secondary side of the transformer. For example, in a higher turns ratio mode, the first switch 116 and the second switch 118 are open as shown in FIG. 1. (e.g., the power supply node is unconnected to the first terminal of the third inductor 106). In this case, current flows between the amplifier 102 and the power supply node VDD through both the first inductor 108 and the third inductor 106. Likewise, current flows between the amplifier 102 and the power supply node VDD through both the second inductor 110 and the fourth inductor 112. As such, the primary coil is effectively formed from (e.g., includes) each of the first inductor 108, the second inductor 110, the third inductor 106, and the fourth inductor 112 (e.g., the four inductors are combined in series).

Figure 2:
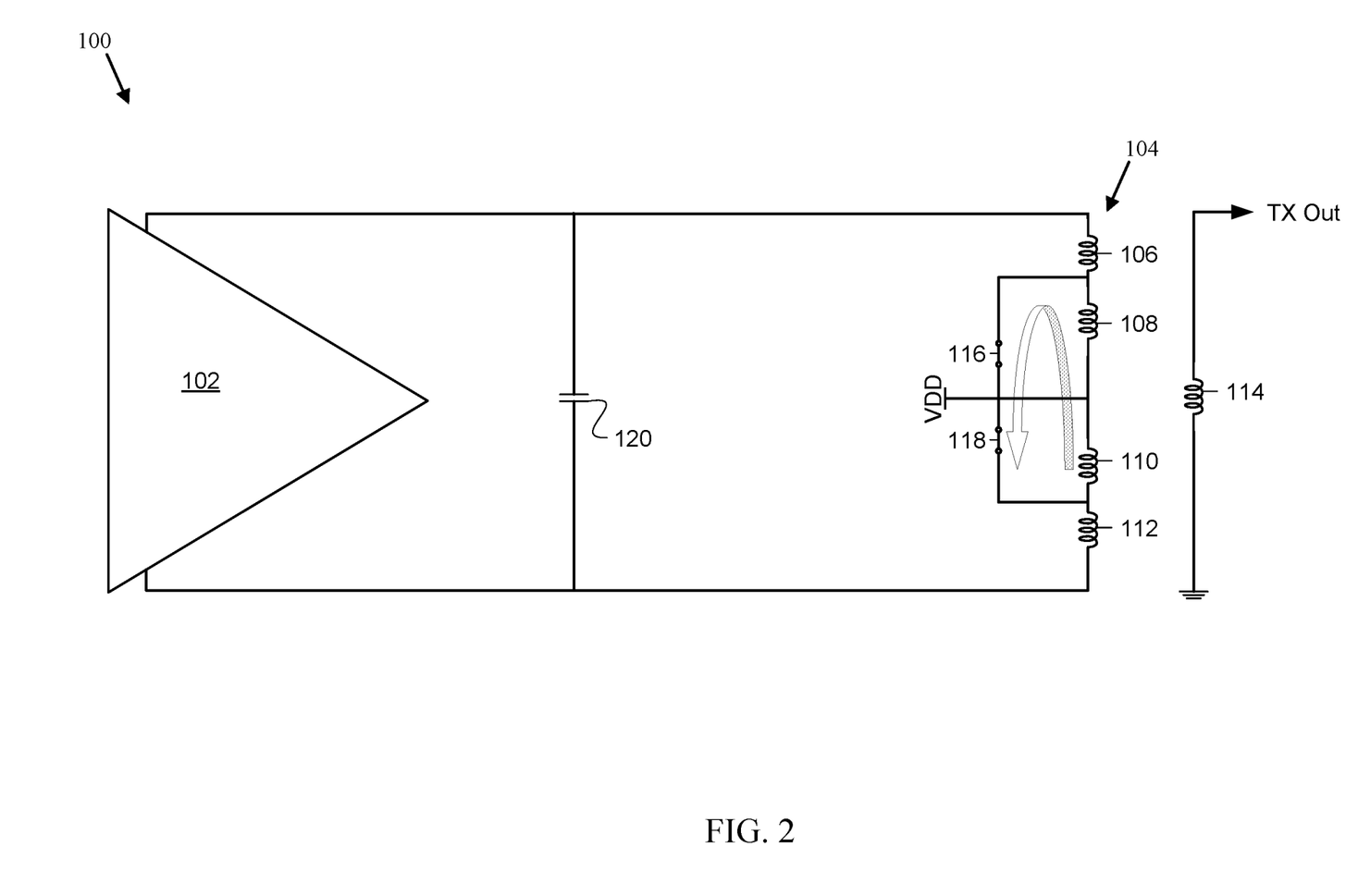
FIG. 2 is a schematic diagram of the circuit of FIG. 1 when the first switch and the second switch of the circuit are closed.

FIG. 2 is a schematic diagram of the circuit 100 of FIG. 1 when the first switch 116 and the second switch 118 are closed which may correspond to a lower turns ratio mode (e.g., relative to the higher turns ratio mode described with reference to FIG. 1). When the first switch 116 is closed, the first terminal of the third inductor 106 is connected to the power supply node VDD and the first inductor 108 is bypassed. In addition, when the second switch 118 is closed the first terminal of the fourth inductor 112 is connected to the power supply node VDD and the second inductor 110 is bypassed. Because the first inductor 108 and the second inductor 110 are bypassed, they effectively do not appear as part of the primary side of the transformer. In this case, the primary side of the transformer is effectively formed by (e.g., includes) the third inductor 106 and the fourth inductor 112 resulting in a transformer with a lower turns ratio. As such, based on a certain power level the switches 116 and 118 are controlled and either the higher turns ratio or the lower turns ratio is used.

When both the first switch 116 and the second switch 118 are closed, a closed loop is formed through which a current may flow through the first inductor 108 and the second inductor 110 as depicted by the arrow in FIG. 2. This circulating current generates an electromagnetic filed that interacts (e.g., mutual coupling, etc.) with the third inductor 106 and the fourth inductor 112 lowering the effective inductance of the third inductor 106 and the fourth inductor 112 and lowering the quality factor. This degrades overall performance. As such, it is desirable to have a configuration which provides for reconfigurability of the turns ratio of an amplifier load transformer while preventing an undesired electromagnetic field from forming.

Figure 3:
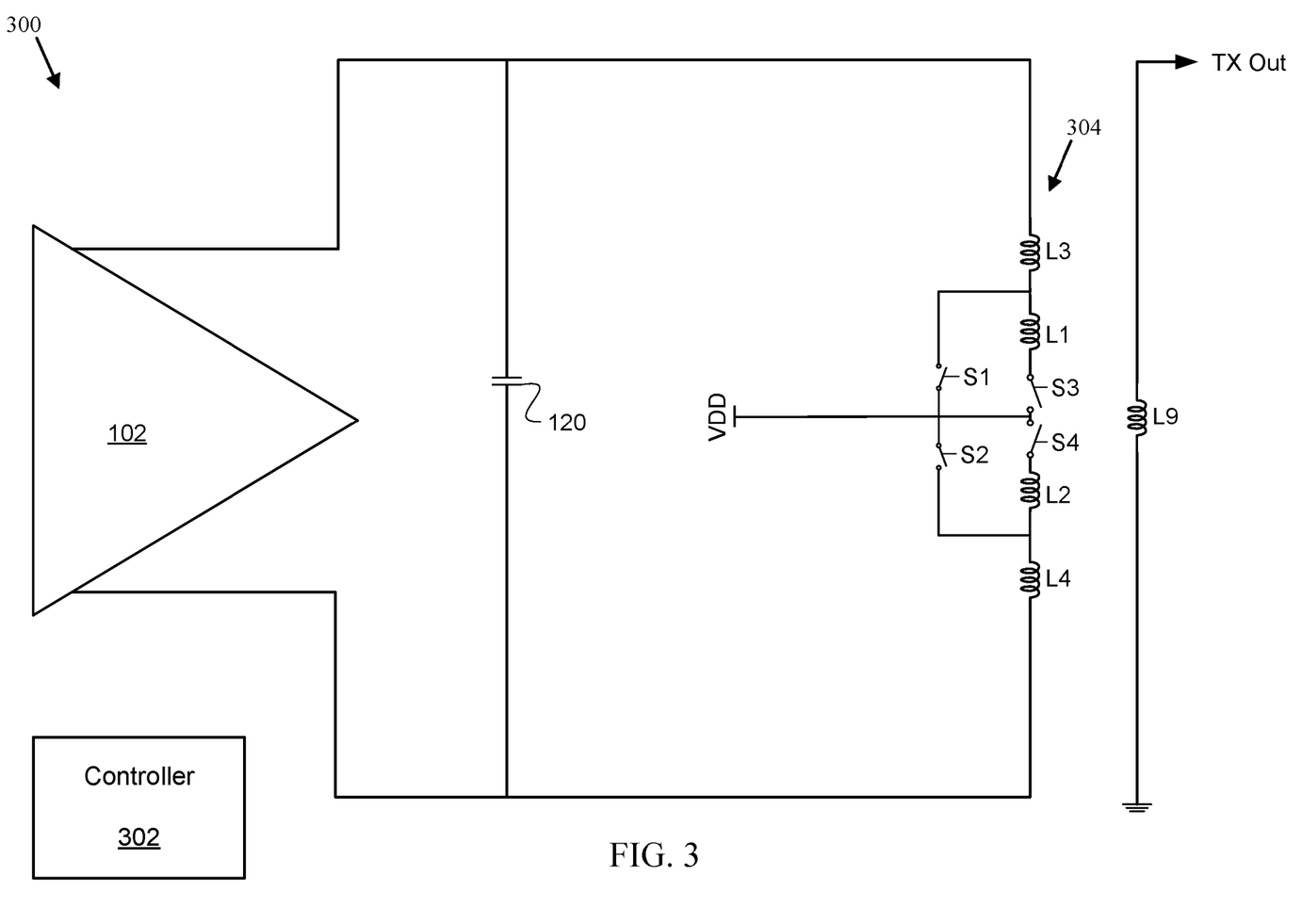
FIG. 3 is a schematic diagram of an example of a circuit including an amplifier with a reconfigurable amplifier load according to an aspect of the present disclosure.

FIG. 3 is a schematic diagram of an example of a circuit 300 including an amplifier 102 with a reconfigurable amplifier load 304 according to an aspect of the present disclosure. The circuit 300 includes an amplifier 102. In certain aspects, the amplifier 102 is a driver amplifier but other types of amplifiers or amplifier stages are also contemplated. The amplifier 102 depicted in FIG. 3 provides first and second outputs (e.g., differential outputs). In certain aspects, the amplifier 102 may be configured as a differential driving amplifier. The circuit 300 further includes a capacitor 120 coupled between the two outputs of the amplifier 102.

The circuit 300 includes a reconfigurable amplifier load 304. The reconfigurable amplifier load 304 includes a power supply node VDD that is connected to a power supply. The reconfigurable amplifier load 304 includes a first inductor L1 including a first terminal coupled to a first switch S1. The reconfigurable amplifier load 304 further includes a second inductor L2 including a first terminal coupled to a second switch S2. The reconfigurable amplifier load 304 further includes a third inductor L3 including a first terminal coupled to the first switch S1. The first switch S1 is configured to selectively couple the first terminal of the third inductor L3 to the power supply node VDD. The reconfigurable amplifier load 304 further includes a fourth inductor L4 including a first terminal coupled to the second switch S2. The second switch S2 is configured to selectively couple the first terminal of the fourth inductor L4 to the power supply node VDD. The first inductor L1, the second inductor L2, the third inductor L3, and the fourth inductor L4 may form portions of a primary side of a transformer. In an aspect, the third inductor L3, the first inductor L1, the second inductor L2, and the fourth inductor L4 are coupled in series. In some aspects, the third inductor L3, the first inductor L1, the second inductor L2, and the fourth inductor L4 may be referred to as a portion of a load line that includes the transformer.

The reconfigurable amplifier load 304 includes an output inductor L9 magnetically coupled to the first inductor L1, the second inductor L2, the third inductor L3, and the fourth inductor L4. The output inductor L9 forms a secondary side of the transformer. The output inductor L9 may provide a single ended input as shown in FIG. 3 where one terminal of the output inductor L9 is electrically connected to ground. In other implementations, the output inductor L9 may have a differential output. The output (Tx out) from the output inductor L9 may be provided to a further amplifier circuit or amplifier stage such as a power amplifier circuit or stage.

In addition to the first switch S1 and the second switch S2, the reconfigurable amplifier load 304 further includes at least one additional switch configured to selectively couple a second terminal of the first inductor L1 or a second terminal of the second inductor L2 or both the second terminal of the first inductor L1 and the second terminal of the second inductor L2 to the power supply node VDD. The at least one additional switch may include a switch having a first terminal connected to the power supply node VDD and a second terminal connected to the second terminal of the first inductor L1 and the second terminal of the second inductor L2.

In an aspect, as illustrated in FIG. 3, the at least one additional switch includes a third switch S3 configured to selectively couple the second terminal of the first inductor L1 to the power supply node VDD. In addition, the at least one additional switch further includes a fourth switch S4 configured to selectively couple the second terminal of the second inductor L2 to the power supply node VDD.

In an aspect, the at least one additional switch is configured to be opened or closed by a first control signal. For example, in the reconfigurable amplifier load 304 of FIG. 3, the third switch S3 and the fourth switch S4 may be configured to be opened or closed by one or more first control signals. In addition, the first switch S1 and the second switch S2 may be both configured to be opened or closed by one or more second control signals. The circuit 300 includes a controller 302 that may be configured to apply the control signals to any of the switches described with reference to FIG. 3 or otherwise described herein. The controller 302 may control various operations of the circuit 300. The controller 302 may control the operation of the amplifier 102 and the switches described herein. The controller 302 may include a memory (may store program codes and data for the controller 302). The controller 302 may execute one or more instruction stored in the memory, including one or more instructions that when executed cause control signals to be applied to the switches described with reference to FIG. 3 in various modes of operation (e.g., different turn ratio modes). The controller 302 may be implemented on one or more application specific integrated circuits (ASICs) and/or other ICs.

As shown in FIG. 3, in an aspect, a second terminal of the third inductor L3 is coupled to a first output of the amplifier 102 (e.g., differential amplifier). In addition, a second terminal of the fourth inductor L4 is coupled to a second output of the amplifier 102 (e.g., differential amplifier).

In operation, when operating in a high turns ratio mode, the first switch S1 and the second switch S2 are open (e.g., a control signal or absence thereof is applied (e.g., by the controller 302) to cause the first switch S1 and the second switch S2 to be in an open state). This may occur when the controller 302 determines that the circuit 300 is operating at a particular power level or within a range of power levels. The third switch S3 and the fourth switch S4 are closed (e.g., control signal is applied (e.g., by the controller 302) to cause the third switch S3 and the fourth switch S4 to be in a closed state). With the first switch S1 open and the third switch S3 closed, current may flow between the amplifier 102 and the power supply node VDD through both the first inductor L1 and the third inductor L3. Likewise, with the second switch S2 open and the fourth switch S4 closed current may flow between the amplifier 102 and the power supply node VDD through both the second inductor L2 and the fourth inductor L4. In this mode, the primary side of the transformer includes the third inductor L3, the first inductor L1, the second inductor L2, and the fourth inductor L4. Each are connected in series and contribute to the overall inductance of the primary side of the transformer.

When operating in a low turns ratio mode, the first switch S1 and the second switch S2 are closed (e.g., a control signal or absence thereof is applied (e.g., by the controller 302) to cause the first switch S1 and the second switch S2 to be in a closed state). In addition, the third switch S3 and the fourth switch S4 are open (e.g., control signal is applied (e.g., by the controller 302) to cause the third switch S3 and the fourth S4 to be in an open state). With the first switch S1 closed, a first terminal of the third inductor L3 is connected directly to the power supply node VDD. Likewise, with the second switch closed S2, a first terminal of the fourth inductor L4 is connected directly to the power supply node VDD. The first inductor L1 and the second inductor L2 are both bypassed. As such, the primary side of the transformer effectively includes the third inductor L3 and fourth inductor L4. The transformer thus has a lower turns ratio as compared to the high turns ratio mode. Because the third switch S3 and the fourth switch S4 are open, there is no loop formed (e.g., the loop is broken) through the first inductor L1 and the second inductor L2 and the power supply node VDD as compared to the circuit 100 shown in FIGS. 1 and 2. Thus, while operating in a low turns ratio mode, there is no additional loop formed and an additional electromagnetic field is not generated (or at least is substantially reduced) that degrades the inductance and quality factor of the third inductor L3 and the fourth inductor L4. Performance is thereby improved with respect to the circuit 100 shown in FIGS. 1 and 2.

As the transformer may be formed from several windings of conductive material, in certain implementations the switches described with reference to the circuit 300 of FIG. 3 may be placed underneath the windings to reduce routing losses and area impact.

Figure 4:
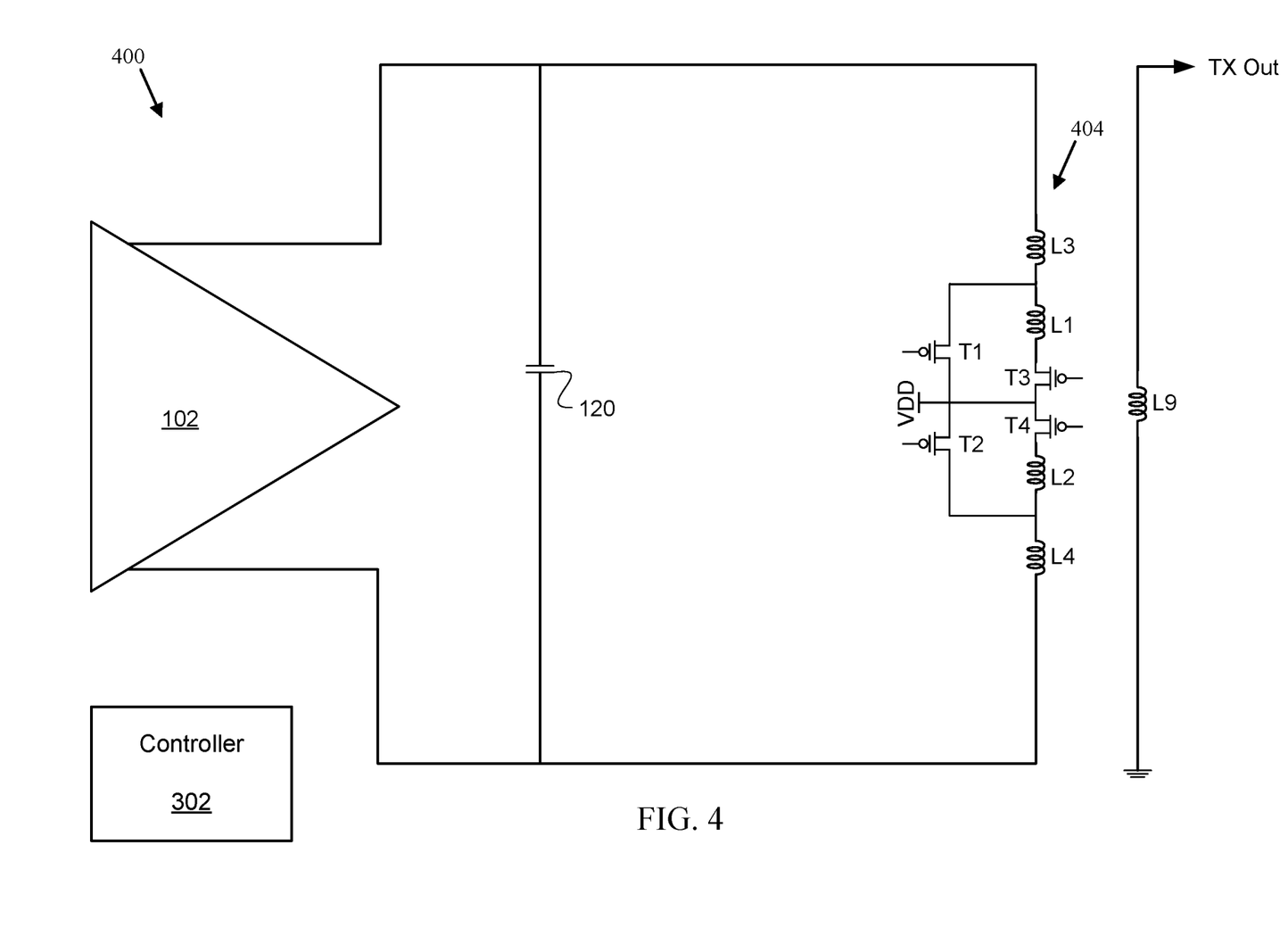
FIG. 4 is a schematic diagram of an example of another circuit including an amplifier with a reconfigurable amplifier load according to an aspect of the present disclosure.

FIG. 4 is a schematic diagram of an example of another circuit 400 including an amplifier 102 with a reconfigurable amplifier load 404 according to an aspect of the present disclosure. The circuit 400 is configured similar to the circuit 300 of FIG. 3, but shows that the switches S1, S2, S3, and S4 described with reference to the circuit 300 of FIG. 3 may be implemented as transistors. For example, the first switch S1 of the circuit 300 of FIG. 3 may be implemented as a first transistor T1 coupled between a first terminal of the third inductor L3 and the power supply node VDD in the reconfigurable amplifier load 404 of FIG. 4. The second switch S2 of the circuit 300 of FIG. 3 may be implemented as a second transistor T2 coupled between a first terminal of the fourth inductor L4 and the power supply node VDD in the reconfigurable amplifier load 404 of FIG. 4. The third switch S3 of the circuit 300 of FIG. 3 may be implemented as a third transistor T3 coupled between a second terminal of the first inductor L1 and the power supply node VDD in the reconfigurable amplifier load 404 of FIG. 4. The fourth switch S4 of the circuit 300 of FIG. 3 may be implemented as a fourth transistor T4 coupled between a second terminal of the second inductor L2 and the power supply node VDD in the reconfigurable amplifier load 404 of FIG. 4.

In certain aspects, gates of the first transistor T1 and the second transistor T2 are coupled together. In certain aspects, gates of the third transistor T3 and the fourth transistor T4 may be coupled together. However, in another aspects each transistor T1, T2, T3, and T4 may be controlled by a different respective control signal.

Figure 5:
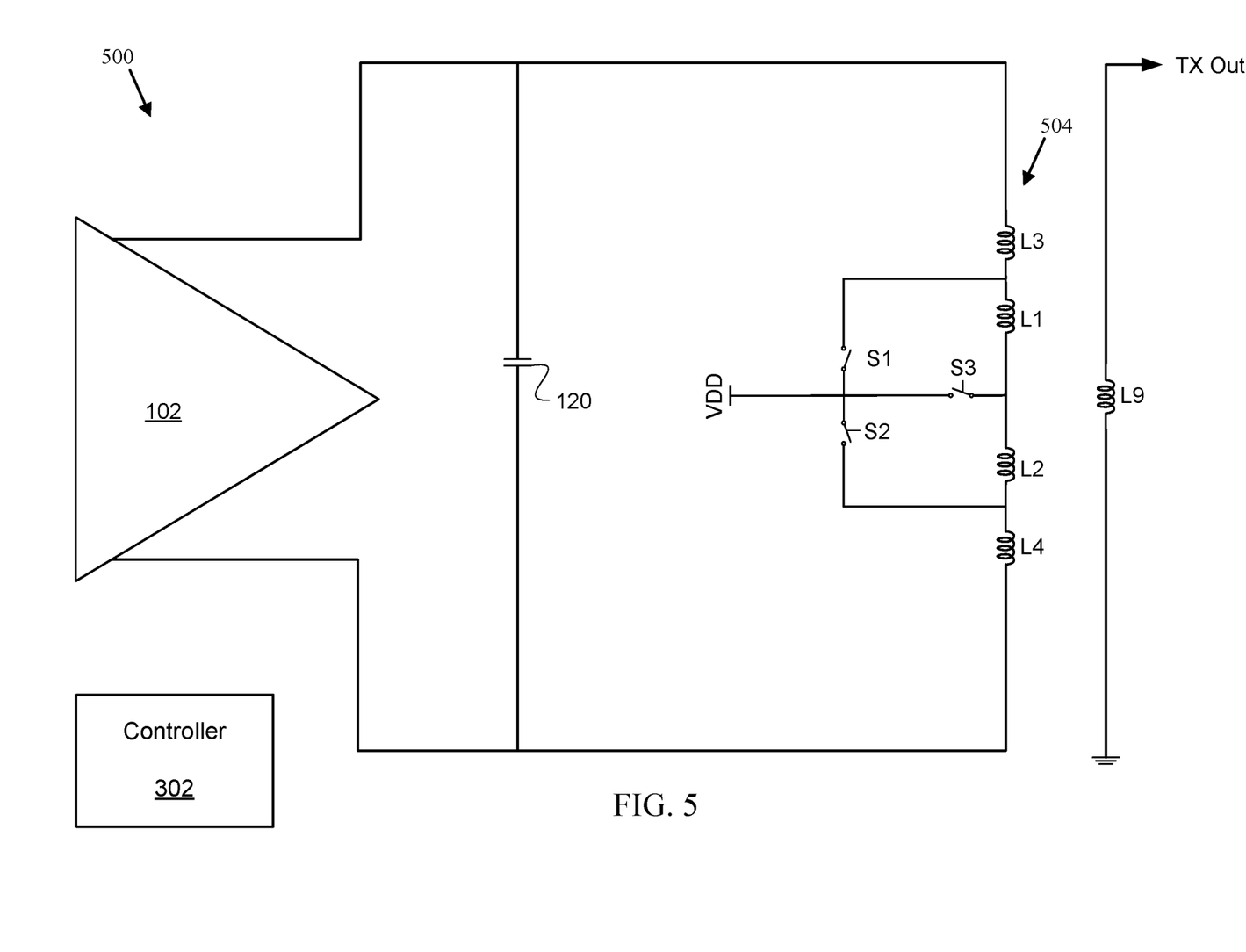
FIG. 5 is a schematic diagram of an example of another circuit including an amplifier with a reconfigurable amplifier load according to an aspect of the present disclosure.

FIG. 5 is a schematic diagram of an example of another circuit 500 including an amplifier 102 with a reconfigurable amplifier load 504 according to an aspect of the present disclosure. The reconfigurable amplifier load 504 is configured similar to the reconfigurable amplifier load 304 of FIG. 3. However, in place of the third switch S3 and the fourth switch S4 of the reconfigurable amplifier load 304 of FIG. 3, the reconfigurable amplifier load 504 of FIG. 5 does not include the fourth switch S4 but includes a third switch S3 coupled between the power supply node VDD and second terminals of each of the first inductor L1 and the second inductor L2.

In operation, in a high turns ratio mode, for the reconfigurable amplifier load 504 of FIG. 5, the first switch S1 and the second switch S2 are controlled to be open while the third switch S3 is closed so that none of the inductors are bypassed. In this case, the primary side of the transformer includes the third inductor L3, the first inductor L1, the second inductor L2, and the fourth inductor L4.

In a low turns ratio mode, the first switch S1 and the second switch S2 are controlled to be closed while the third switch S3 is controlled to be open. In this case, the primary side of the transformer includes the third inductor L3 and the fourth inductor L4. Leaving the third switch S3 open prevents a loop from being formed that would otherwise generate an undesired electromagnetic field as described above.

Figure 6:
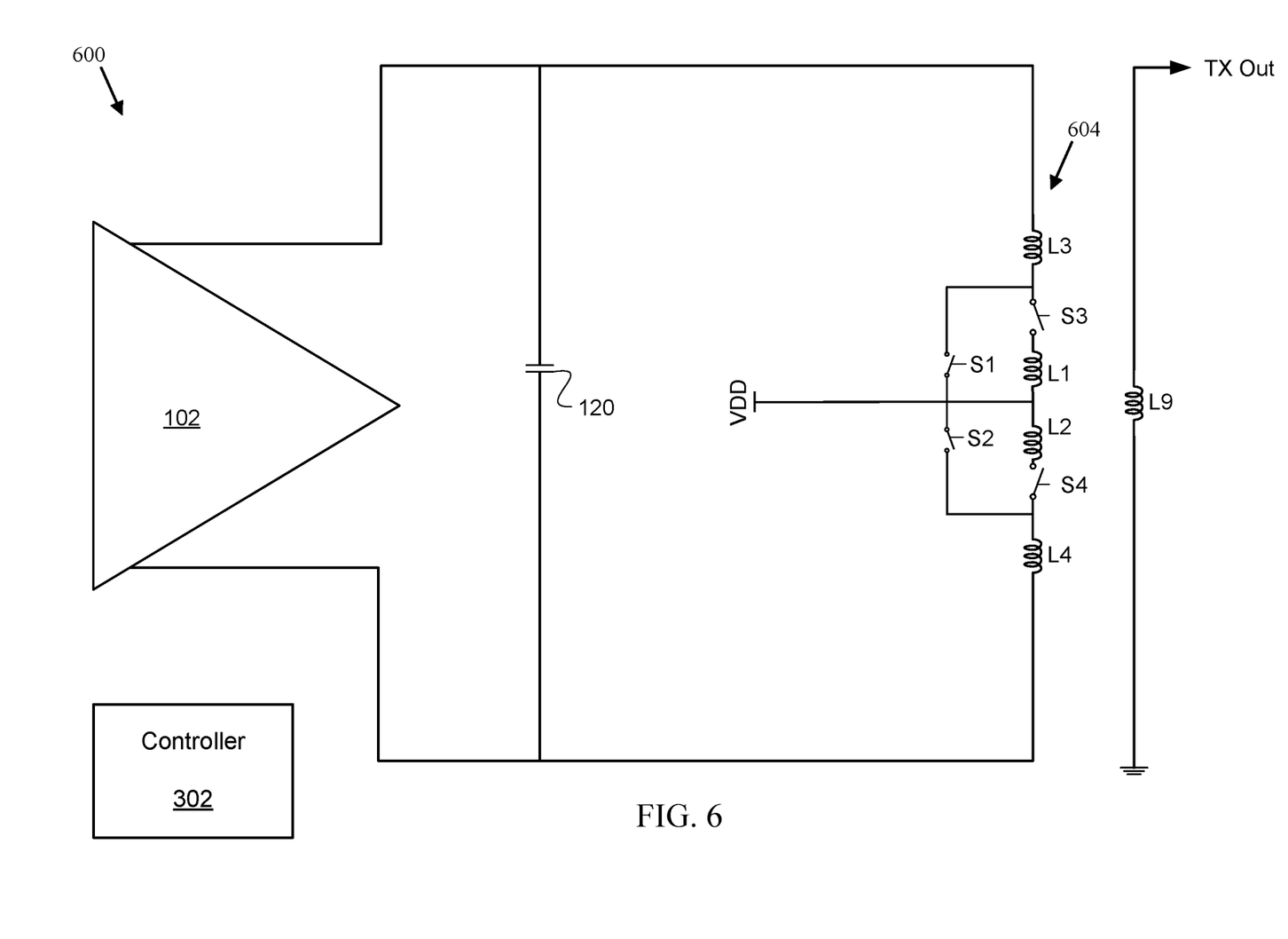
FIG. 6 is a schematic diagram of an example of another circuit including an amplifier with a reconfigurable amplifier load according to an aspect of the present disclosure.

FIG. 6 is a schematic diagram of an example of another circuit 600 including an amplifier 102 with a reconfigurable amplifier load 604 according to an aspect of the present disclosure. The reconfigurable amplifier load 604 is similar to the reconfigurable amplifier load 304 of FIG. 3, but the location of the third switch S3 and the fourth switch S4 of FIG. 3 are positioned on a different side of the first inductor L1 and the second inductor L2. Particularly, the reconfigurable amplifier load 604 includes a first inductor L1 that includes a first terminal coupled to a first terminal of a third switch S3. The inductor L1 further includes a second terminal coupled to a power supply node VDD. The reconfigurable amplifier load 604 includes a second inductor L2 that includes a first terminal coupled to a first terminal of a fourth switch S4. The second inductor L2 further includes a second terminal coupled to the power supply node VDD. The reconfigurable amplifier load 604 further includes a third inductor L3 that includes a first terminal coupled to a second terminal of the third switch S3 and to the first switch S1. The first switch S1 is configured to selectively couple the first terminal of the third inductor L3 to the power supply node VDD. The reconfigurable amplifier load 604 further includes a fourth inductor L4 that includes a first terminal coupled to a second terminal of the fourth switch S4 and to a second switch S2. The second switch S2 is configured to selectively couple the first terminal of the fourth inductor L4 to the power supply node VDD.

The operation of the reconfigurable amplifier load 604 is similar to the operation of the reconfigurable amplifier load 304 of FIG. 3. In particular, in a high turns ratio mode, based on one or more control signals, the first switch S1 and the second switch S2 are open while the third switch S3 and the fourth switch S4 are closed. In a low turns ratio mode, based on one or more control signals the first switch S1 and the second switch S2 are closed while the third switch S3 and the fourth switch S4 are opened. Opening of the third switch S3 and the fourth switch S4 prevents any loop from being formed through the first inductor L1 and the second inductor L2 and the power supply node VDD in the low turns ratio mode.

Figure 7:
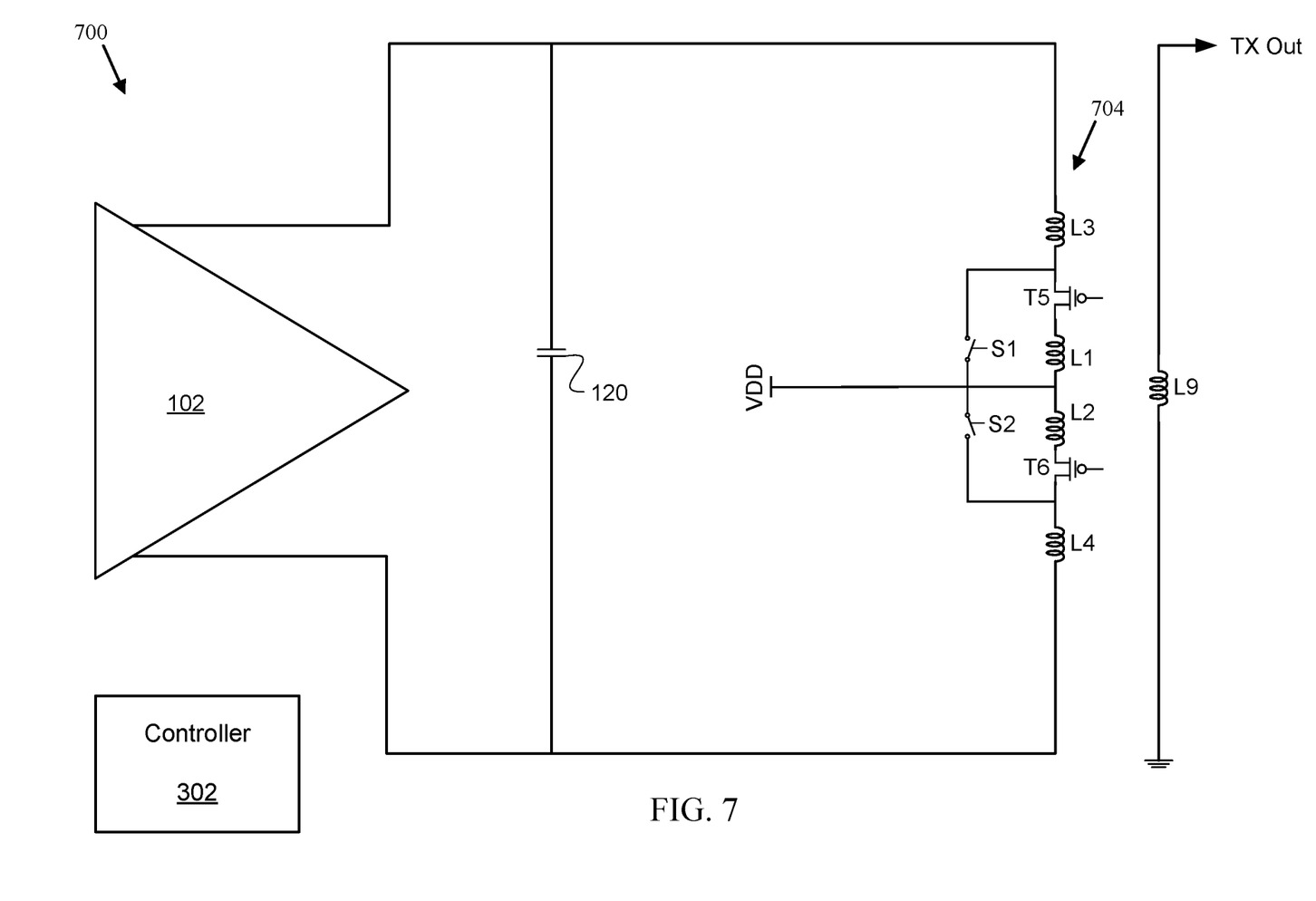
FIG. 7 is a schematic diagram of an example of another circuit including an amplifier with a reconfigurable amplifier load according to an aspect of the present disclosure.

FIG. 7 is a schematic diagram of an example of another circuit 700 including an amplifier 102 with a reconfigurable amplifier load 704 according to an aspect of the present disclosure. The circuit 700 is configured similar to the circuit 600 of FIG. 6 but shows that certain switches described with reference to the circuit 600 of FIG. 6 may be implemented as transistors. For example, the third switch S3 of the circuit 600 of FIG. 6 may be implemented as a first transistor T5. In addition, the fourth switch S4 of the circuit 600 of FIG. 6 may be implemented as a second transistor T6. In certain aspects, gates of the first transistor T5 and the second transistor T6 are coupled together. While not shown in FIG. 7, the first switch S1 and the second switch S2 of the reconfigurable amplifier load 704 of FIG. 7 may also be implemented by transistors (e.g., similarly as illustrated with respect to FIG. 4). Note that while the transistors depicted in the figures may be depicted as P-channel field effect transistors (PFETs), any of the transistors described herein may be implemented as either N-channel field effect transistors (NFETs) or PFETs (e.g., P-channel metal oxide semiconductor (PMOS) transistors or N-channel metal oxide semiconductor (NMOS) transistors) or other types of transistors. The transistors described herein may be implemented with a selected on-resistance to reduce losses through the load transformer.

Figure 8:
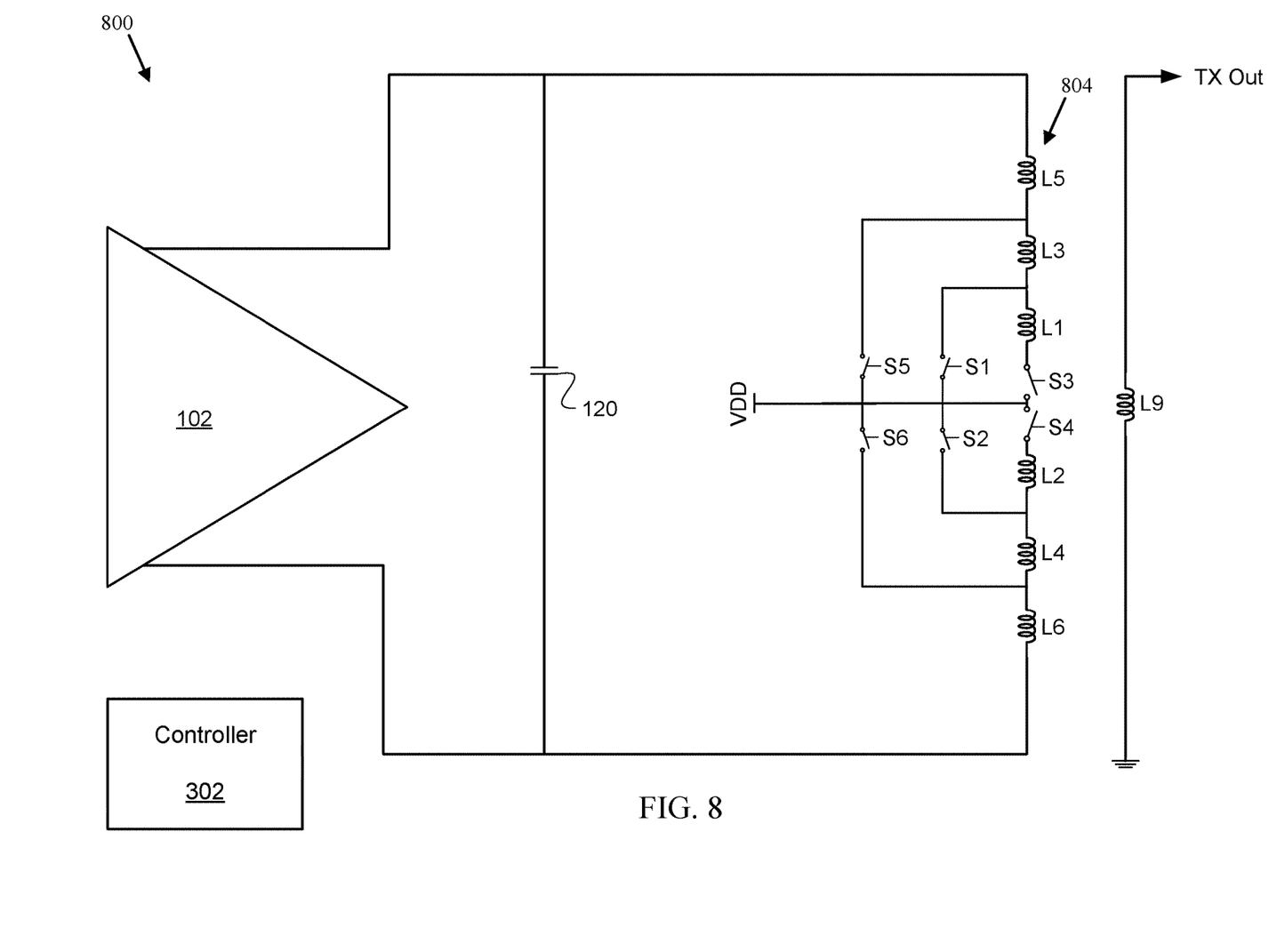
FIG. 8 is a schematic diagram of an example of another circuit including an amplifier with a reconfigurable amplifier load according to an aspect of the present disclosure.

FIG. 8 is a schematic diagram of an example of another circuit 800 including an amplifier 102 with a reconfigurable amplifier load 804 according to an aspect of the present disclosure. The reconfigurable amplifier load 804 of FIG. 8 is similar to the reconfigurable amplifier load 304 of FIG. 3 but includes additional inductors and additional switches to allow for increased reconfigurability (e.g., additional turn ratio modes). The reconfigurable amplifier load 804 includes the first inductor L1, the second inductor L2, the third inductor, L3, and the fourth inductor L4 coupled as described above with reference to the reconfigurable amplifier load 304 of FIG. 3. In addition, the reconfigurable amplifier load 804 includes the first switch S1, the second switch S2, the third switch S3, and the fourth switch S4 coupled as described above with reference to the reconfigurable amplifier load 304 of FIG. 3.

In addition, the reconfigurable amplifier load 804 includes a fifth inductor L5 that includes a first terminal coupled to a fifth switch S5. The fifth inductor L5 is also coupled to a second terminal of the third inductor L3. The fifth switch S5 is configured to selectively couple the first terminal of the fifth inductor L5 to the power supply node VDD. The reconfigurable amplifier load 804 further includes a sixth inductor L6 including a first terminal coupled to a sixth switch S6. The sixth inductor L6 is also coupled to a second terminal of the fourth inductor L4. The sixth switch S6 is configured to selectively couple the first terminal of the sixth inductor L6 to the power supply node VDD. The secondary side of the transformer includes the output inductor L9 that is magnetically coupled to the fifth inductor L5, the third inductor L3, the first inductor L1, the second inductor L2, the fourth inductor L4, and the sixth inductor L6.

The primary side of the transformer in the highest turns ratio mode may include the fifth inductor L5, the third inductor L3, the first inductor L1, the second inductor L2, the fourth inductor L4, and the sixth inductor L6.

In a first turn ratio mode (e.g., highest turn ratio mode), the first switch S1, the second switch S2, the fifth switch S5, and the sixth switch S6 are open while the third switch S3 and the fourth switch S4 are closed. In this case, current can flow between one output of the amplifier 102 and the power supply node VDD through each of the fifth inductor L5, the third inductor L3, and the first inductor L1 Likewise, current can flow between the other output of the amplifier 102 and the power supply node VDD through each of the sixth inductor L6, the fourth inductor L4, and the second inductor L2. Thus, the primary side of the transformer is formed from each of the six inductors and thus has a certain turn ratio with the output inductor L9.

In a second turns ratio mode, the fifth switch S5 and the sixth switch S6 are closed. The first switch S1 and the second switch S2 are open. Similar to what has been described above, closing the fifth switch S5 and the sixth switch S6 effectively causes current flow to bypass the third inductor L3, the first inductor L1, the second inductor L2, and the fourth inductor L4. The primary side of the transformer therefore effectively includes the fifth inductor L5 and the sixth inductor L6 resulting in a different (e.g., lower) turn ratio with the output inductor L9 as compared to the first turns ratio mode. Also in this second turns ratio mode, the third switch S3 and the fourth switch S4 are open. Maintaining the third switch S3 and the fourth switch S4 open breaks the loop that would have otherwise been formed by the third inductor L3, the first inductor L1, the second inductor L2, and the fourth inductor L4 around through the power supply node VDD. This prevents the undesired electromagnetic field from being generated.

In a third turns ratio mode, the first switch S1 and the second switch S2 are closed. In this case, the third switch S3 and the fourth switch S4 are open. The fifth switch S5 and the sixth switch S6 are also open. Closing the first switch S1 and the second switch S2 causes current flow to bypass the first inductor L1 and the second inductor L2. The primary side of the transformer therefore effectively includes the fifth inductor L5, the third inductor L3, the fourth inductor L4 and the sixth inductor L6 resulting in a different turns ratio with the output inductor L9 as compared to the first and second turns ratio modes. Maintaining the third switch S3 and the fourth switch S4 open breaks the loop that would have otherwise been formed by the first inductor L1 and the second inductor L2 through the power supply node VDD which prevents the undesired electromagnetic field from being generated. Similar to FIG. 6, the third switch S3 and the fourth switch S4 may be respectively on opposite sides of the first inductor L1 and the second inductor L2 as compared to the side depicted in FIG. 8. In addition, the switches of FIG. 8 may be implemented by transistors.

Figure 9:
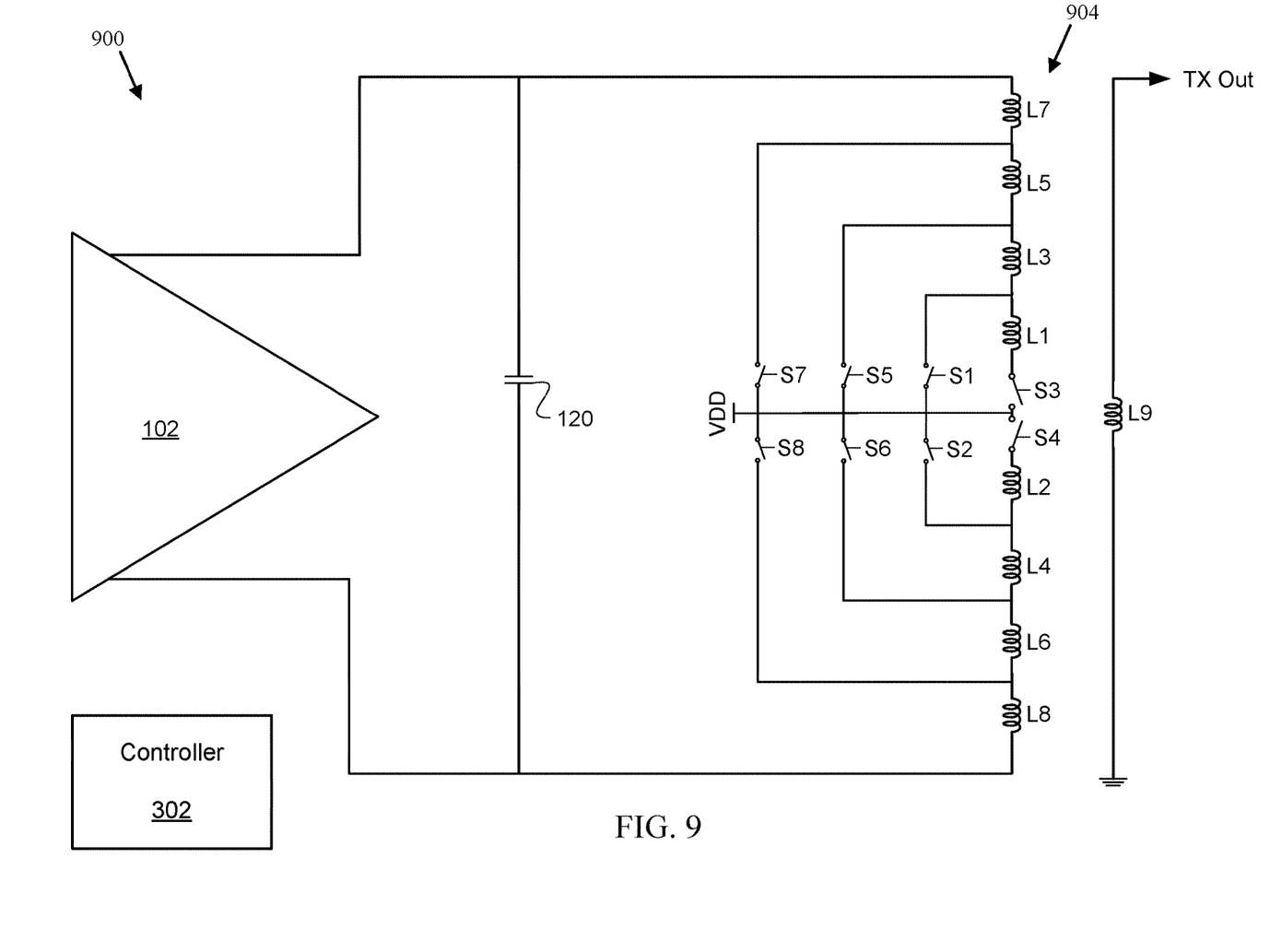
FIG. 9 is a schematic diagram of an example of another circuit including an amplifier with a reconfigurable amplifier load according to an aspect of the present disclosure.

FIG. 9 is a schematic diagram of an example of another circuit 900 including an amplifier 102 with a reconfigurable amplifier load 904 according to an aspect of the present disclosure. The reconfigurable amplifier load 904 of FIG. 9 is similar to the reconfigurable amplifier load 804 of FIG. 8 but includes additional inductors and additional switches to allow for increased reconfigurability (e.g., additional turn ratio modes). The reconfigurable amplifier load 904 includes the first inductor L1, the second inductor L2, the third inductor, L3, the fourth inductor L4, the fifth inductor L5, and the sixth inductor L6 coupled as described above with reference to the reconfigurable amplifier load 804 of FIG. 8. In addition, the reconfigurable amplifier load 904 includes the first switch S1, the second switch S2, the third switch S3, the fourth switch S4, the fifth switch S5, and the sixth switch S6 coupled as described above with reference to the reconfigurable amplifier load 804 of FIG. 4.

In addition, the reconfigurable amplifier load 904 includes a seventh inductor L7 that includes a first terminal coupled to a seventh switch S7. The seventh inductor L7 is further coupled to a second terminal of the fifth inductor L5. The seventh switch S7 is configured to selectively couple the first terminal of the seventh inductor L7 to the power supply node VDD. The reconfigurable amplifier load 904 further includes an eighth inductor L8 that includes a first terminal coupled to an eighth switch S8. The eighth inductor L8 is also coupled to a second terminal of the sixth inductor L6. The eighth switch S8 is configured to selectively couple the first terminal of the eighth inductor L8 to the power supply node VDD. These additional inductors add an additional dimension of reconfigurability to the reconfigurable amplifier load 904.

The primary side of the transformer in the highest turns ratio mode may thus include the seventh inductor, the fifth inductor L5, the third inductor L3, the first inductor L1, the second inductor L2, the fourth inductor L4, the sixth inductor L6, and the eight inductor L8. The secondary side of the transformer includes the output inductor L9 that is magnetically coupled to the seventh inductor L7, the fifth inductor L5, the third inductor L3, the first inductor L1, the second inductor L2, the fourth inductor L4, the sixth inductor L6, and the eighth inductor L8.

The reconfigurable amplifier load 904 may be operated in at least four turn ratio modes as compared to the three turn ratio modes described with reference to the reconfigurable amplifier load 804 of FIG. 8.

In the highest turn ratio mode with respect to the circuit 900 of FIG. 9, the first switch S1, the second switch S2, the fifth switch S5, the sixth switch S6, the seventh switch S7, and the eighth switch S8 are open and the third switch S3 and the fourth switch S4 are closed. In this case, current can flow between one output of the amplifier 102 and the power supply node VDD through each of the seventh inductor L7, the fifth inductor L5, the third inductor L3, and the first inductor L1. Likewise, current can flow between the other output of the amplifier 102 and the power supply node VDD through each of the eighth inductor L8, the sixth inductor L6, the fourth inductor L4, and the second inductor L2. Thus, the primary side of the transformer is formed from each of the eight inductors and thus has a certain turn ratio with the output inductor L9 from the combined six inductors.

In an additional turns ratio mode, the seventh switch S7 and the eighth switch S8 are closed. The first switch S1, the second switch S2, the fifth switch S5, and the sixth switch S6 are open. This effectively bypasses the fifth inductor L5, the third inductor L3, the first inductor L1, the second inductor L2, the fourth inductor L4, and the sixth inductor L6. The primary side of the transformer therefore effectively includes the seventh inductor L7 and the eighth inductor L8 resulting in a different (e.g., lower) turn ratio with the output inductor L9 as compared to the highest turns ratio mode. Also in this mode, the third switch S3 and the fourth switch S4 are open. Maintaining the third switch S3 and the fourth switch S4 open breaks the loop that would have otherwise been formed by the fifth inductor L5, the third inductor L3, the first inductor L1, the second inductor L2, the fourth inductor L4, and the sixth inductor L6 around through the power supply node VDD. This prevents the undesired electromagnetic field from being generated. Similar to FIG. 6, the third switch S3 and the fourth switch S4 may be respectively on opposite sides of the first inductor L1 and the second inductor L2 as compared to the side depicted in FIG. 8. In addition, the switches of FIG. 8 may be implemented by transistors.

The other turn ratio modes for the reconfigurable amplifier load 904 of FIG. 9 operate in the same manner as those described with reference the reconfigurable amplifier load 804 of FIG. 8.

As noted above, for the reconfigurable amplifier loads 804 and 904 of FIGS. 8 and 9, similar to FIG. 6, the third switch S3 and the fourth switch S4 may be respectively on opposite sides of the first inductor L1 and the second inductor L2 as compared to the sides depicted in FIGS. 8 and 9. As such, a further example implementation with respect to the reconfigurable amplifier load 604 of FIG. 6 may be provided where the reconfigurable amplifier load 604 may further include a fifth inductor L5 (shown in FIG. 8) that has a first terminal coupled to a fifth switch S5 (FIG. 8) and to a second terminal of the third inductor L3 (FIGS. 6 and 8). The fifth switch S5 is configured to selectively couple the first terminal of the fifth inductor L5 to the power supply node VDD. The reconfigurable amplifier load 604 of FIG. 6 may further include a sixth inductor L6 (shown in FIG. 8) that includes a first terminal coupled to a sixth switch S6 (FIG. 8) and to a second terminal of the fourth inductor L4 (FIGS. 6 and 8). The sixth switch S6 is configured to selectively couple the first terminal of the sixth inductor to the power supply node VDD.

In a further implementation of the reconfigurable amplifier load 604 of FIG. 6, the reconfigurable amplifier load 604 may further include a seventh inductor L7 (shown in FIG. 9) that has a first terminal coupled to a seventh switch S7 (FIG. 9) and to a second terminal of the fifth inductor L5 (FIG. 9). The seventh switch S7 is configured to selectively couple the first terminal of the seventh inductor L7 to the power supply node VDD. The reconfigurable amplifier load 604 may further include an eighth inductor L8 that has a first terminal coupled to an eighth switch S8 (FIG. 9) and to a second terminal of the sixth inductor L6 (FIG. 9). The eighth switch S8 is configured to selectively couple the first terminal of the eighth inductor L8 to the power supply node VDD.

It should be appreciated that while the description of the reconfigurable amplifier loads described above with reference to FIGS. 3-9 describes certain elements coupled to other elements, certain implementations are contemplated that may allow for other intervening circuit elements to be connected between the described elements.

Figure 10:
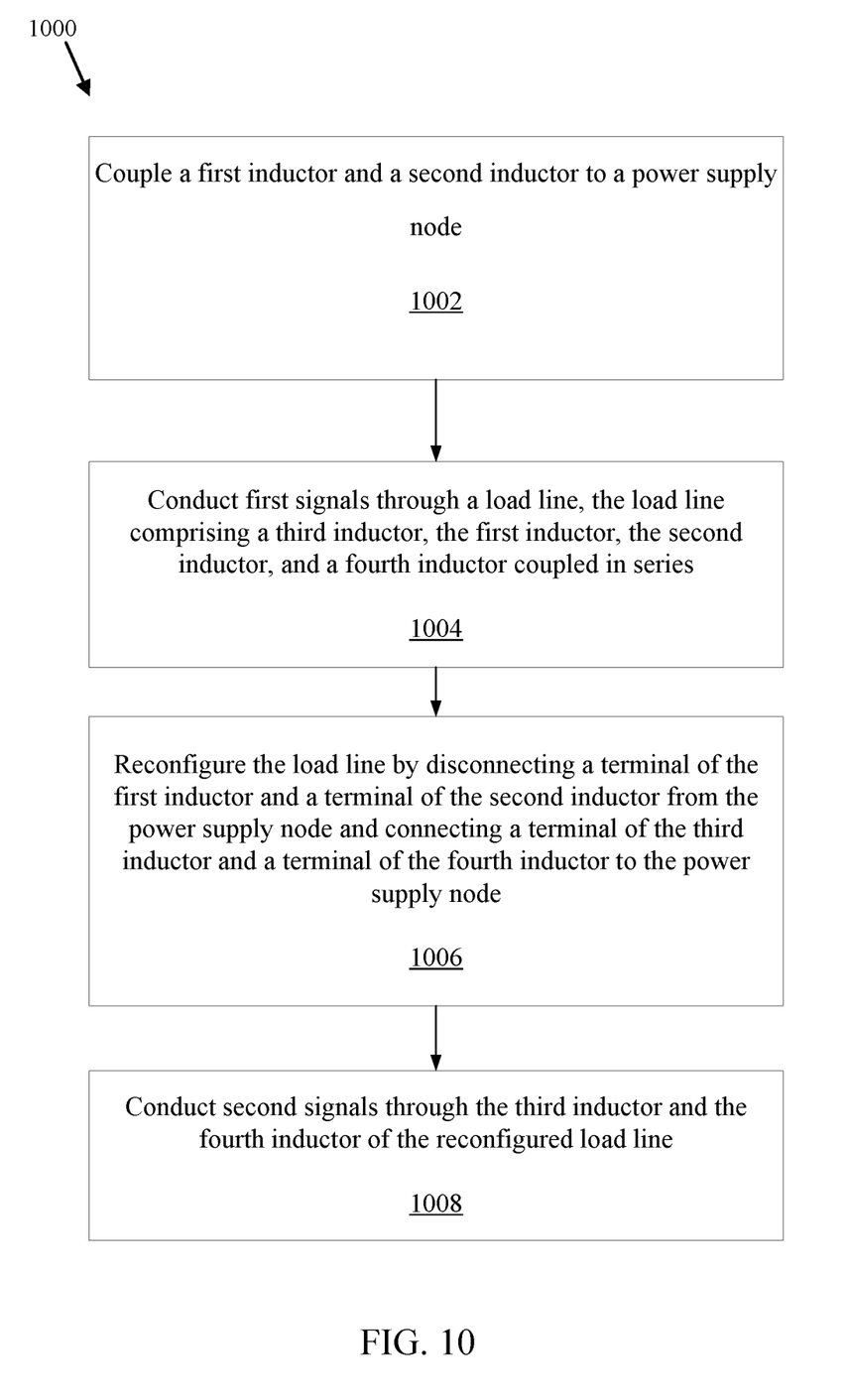
FIG. 10 is a flowchart of a reconfigurable load line operation methods according to an aspect of the present disclosure.

FIG. 10 is a flowchart of a reconfigurable load line operation method 1000 according to an aspect of the present disclosure. The method 1000 is described with reference to FIG. 3, however the techniques described may be implemented using any of the previously described elements. Reference to elements is made by example only and is not intended to limit the ways in which the techniques can be implemented. The depicted sets of operations illustrate a few of the many ways in which the techniques may be implemented. As such, operations of a method may be repeated, combined, separated, omitted, performed in alternate orders, performed concurrently.

At block 1002, the method 1000 may include coupling a first inductor L1 and a second inductor L2 to a power supply node VDD. At block 1004, the method 1000 further includes conducting first signals through a load line, the load line including a third inductor L3, the first inductor L1, the second inductor L2, and a fourth inductor L4 coupled in series.

At block 1004, the method 1000 further includes reconfiguring the load line by disconnecting a terminal of the first inductor L1 and a terminal of the second inductor L2 from the power supply node VDD and connecting a terminal of the third inductor L3 and a terminal of the fourth inductor L4 to the power supply node VDD. At block 1008, the method further includes conducting second signals through the third inductor L3 and the fourth inductor L4 of the reconfigured load line.

In an aspect, the method 1000 may further include magnetically coupling the first signal conductive by the load line to an output inductor L9 of the load line and magnetically coupling the second signals conducted by the load line to the output inductor.

In an aspect, the method 1000 may include generating the first signals using a differential driving amplifier 102 coupled to the load line and generating the second signals using the differential driving amplifier.

In certain aspects, the disconnecting of block 1004 of the terminal of the first inductor L1 and a terminal of the second inductor L2 from the power supply node VDD and connecting a terminal of the third inductor L3 and a terminal of the fourth inductor L4 to the power supply node VDD may include controlling one or more switches.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. For example, the means for selectively coupling may include one or more switches (e.g., transistors).

Generally, where there are operations illustrated in figures, those operations may have corresponding counterpart means-plus-function components with similar numbering.

Aspects of various circuits and amplifiers described herein may be incorporated into a wireless device communicating with a wireless communication system. The wireless system may be a long term evolution (LTE) system, a 5th generation wireless system (5G), a code division multiple access (CDMA) system, a global system for mobile communications (GSM) system, a wireless local area network (WLAN) system, or some other wireless system, or combination thereof. A CDMA system may implement wideband CDMA (WCDMA), time division synchronous CDMA (TD-SCDMA), CDMA2000, or some other version of CDMA. The wireless device may be a base station, a user equipment (UE), a mobile station, a terminal, an access terminal, a subscriber unit, a station, etc. The wireless device may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, and the like. The wireless device may support one or more radio technologies for wireless communication such as LTE, CDMA2000, WCDMA, TD-SCDMA, GSM, 802.11, etc.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general-purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A reconfigurable amplifier load comprising:
    a power supply node;
    a first inductor comprising a first terminal coupled to a first switch;
    a second inductor comprising a first terminal coupled to a second switch;
    a third inductor comprising a first terminal coupled to the first switch, the first switch configured to selectively couple the first terminal of the third inductor to the power supply node;
    a fourth inductor comprising a first terminal coupled to the second switch, the second switch configured to selectively couple the first terminal of the fourth inductor to the power supply node; and
    at least one additional switch configured to selectively couple a second terminal of the first inductor or a second terminal of the second inductor or both the second terminal of the first inductor and the second terminal of the second inductor to the power supply node.

2. The reconfigurable amplifier load of claim 1 wherein the at least one additional switch comprises a switch having a first terminal connected to the power supply node and a second terminal connected to the second terminal of the first inductor and the second terminal of the second inductor.

3. The reconfigurable amplifier load of claim 1 wherein the at least one additional switch comprises a switch configured to selectively couple the second terminal of the first inductor to the power supply node and a switch configured to selectively couple the second terminal of the second inductor to the power supply node.

4. The reconfigurable amplifier load of claim 1 further comprising:
  a fifth inductor comprising:
  a first terminal coupled to a third switch and to a second terminal of the third inductor, the third switch configured to selectively couple the first terminal of the fifth inductor to the power supply node; and
  a sixth inductor comprising:
  a first terminal coupled to a fourth switch and to a second terminal of the fourth inductor, the fourth switch configured to selectively couple the first terminal of the sixth inductor to the power supply node.

5. The reconfigurable amplifier load of claim 4 further comprising:
  a seventh inductor comprising:
  a first terminal coupled to a fifth switch and to a second terminal of the fifth inductor, the fifth switch configured to selectively couple the first terminal of the seventh inductor to the power supply node; and
  an eighth inductor comprising:
  a first terminal coupled to a sixth switch and to a second terminal of the sixth inductor, the sixth switch configured to selectively couple the first terminal of the eighth inductor to the power supply node.

6. The reconfigurable amplifier load of claim 1 wherein the first switch comprises a first transistor, the second switch comprises a second transistor and gates of the first transistor and the second transistor are coupled together.

7. The reconfigurable amplifier load of claim 1 further comprising an output inductor magnetically coupled to the first inductor, the second inductor, the third inductor, and the fourth inductor.

8. The reconfigurable amplifier load of claim 1 wherein the third inductor, the first inductor, the second inductor, and the fourth inductor are coupled in series.

9. The reconfigurable amplifier load of claim 1 wherein:
  the at least one additional switch is configured to be opened or closed by a first control signal; and
  the first switch and the second switch are both configured to be opened or closed by a second control signal.

10. The reconfigurable amplifier load of claim 1 wherein:
  a second terminal of the third inductor is coupled to a first output of a differential amplifier; and
  a second terminal of the fourth inductor is coupled to a second output of the differential amplifier.

* * * * *